(12) United States Patent
Adkisson et al.

(10) Patent No.: US 9,252,204 B2
(45) Date of Patent: Feb. 2, 2016

(54) METAL INSULATOR METAL (MIM) CAPACITOR STRUCTURE

(75) Inventors: James W. Adkisson, Jericho, VT (US); Panglijen Candra, Essex Junction, VT (US); Kevin N. Ogg, Essex Junction, VT (US); Anthony K. Stamper, Williston, VT (US)

(73) Assignee: GlobalFoundries, Inc., Grand Cayman, KY (US)

( * ) Notice: Subject to any disclaimer, the term of this patent is extended or adjusted under 35 U.S.C. 154(b) by 277 days.

(21) Appl. No.: 13/233,752

(22) Filed: Sep. 15, 2011

(65) Prior Publication Data

US 2013/0069199 A1 Mar. 21, 2013

(51) Int. Cl.
*H01L 49/02* (2006.01)

(52) U.S. Cl.
CPC ...................................... *H01L 28/90* (2013.01)

(58) Field of Classification Search
CPC .... H01L 29/66181; H01L 28/40; H01L 28/60
USPC ......... 438/386, 171, 190, 210, 243, 244, 387; 257/301
See application file for complete search history.

(56) References Cited

U.S. PATENT DOCUMENTS

| | | | |
|---|---|---|---|
| 6,341,056 B1 * | 1/2002 | Allman et al. ................. | 361/312 |
| 6,362,012 B1 | 3/2002 | Chi et al. | |
| 6,417,535 B1 | 7/2002 | Johnson et al. | |
| 6,451,667 B1 | 9/2002 | Ning | |
| 6,472,721 B2 | 10/2002 | Ma et al. | |
| 6,528,366 B1 * | 3/2003 | Tu et al. ......................... | 438/253 |
| 6,593,185 B1 | 7/2003 | Tsai et al. | |
| 6,624,040 B1 | 9/2003 | Ng et al. | |
| 6,706,588 B1 | 3/2004 | Ning | |
| 6,709,918 B1 | 3/2004 | Ng et al. | |
| 6,876,027 B2 | 4/2005 | Lien et al. | |
| 6,891,219 B2 | 5/2005 | Allman et al. | |
| 7,078,759 B2 * | 7/2006 | Takeuchi ....................... | 257/300 |
| 7,091,542 B1 | 8/2006 | Yang et al. | |
| 7,091,562 B2 | 8/2006 | Yang | |
| 7,095,073 B2 | 8/2006 | Balakumar et al. | |
| 7,378,719 B2 | 5/2008 | Yang | |
| 7,383,475 B1 * | 6/2008 | Corbin .......................... | 714/718 |
| 7,416,953 B2 | 8/2008 | Lee et al. | |
| 7,638,830 B2 | 12/2009 | Hsin et al. | |
| 7,682,896 B2 | 3/2010 | Ho et al. | |
| 7,741,188 B2 | 6/2010 | Dyer et al. | |
| 2005/0275005 A1 * | 12/2005 | Choi et al. ..................... | 257/300 |
| 2009/0090998 A1 * | 4/2009 | Woo ............................... | 257/532 |
| 2010/0127316 A1 * | 5/2010 | Tu et al. ......................... | 257/296 |

* cited by examiner

*Primary Examiner* — Yu-Hsi D Sun
(74) *Attorney, Agent, or Firm* — Anthony J. Canale; Hoffman Warnick LLC (57) ABSTRACT

A MIM capacitor includes a dielectric cap that enhances performance and reduces damage to MIM insulators during manufacture. A cavity is formed in an insulative substrate, such as a back end of line dielectric layer, and a first metal layer and an insulator layer are conformally deposited. A second metal layer may be deposited conformally and/or to fill a remaining portion of the cavity. The dielectric cap may be an extra layer of insulative material deposited at ends of the insulator at an opening of the cavity and may also be formed as part of the insulator layer.

19 Claims, 12 Drawing Sheets

METAL INSULATOR METAL (MIM) CAPACITOR STRUCTURE

BACKGROUND

The present invention relates to microfabrication of semiconductor devices, and, more specifically, to structures and fabrication methods of metal-insulator-metal (MIM) capacitors.

Current MIM capacitors are limited in size because they typically include two metal plates with an insulator between the plates. In such a configuration, the plates must have a significant surface area to achieve desired capacitances. One solution for this has been to develop a MIM capacitor oriented transversely to a surface of surrounding substrate, such as an insulated through-silicon-via (TSV) type MIM. However, the via configuration imposes limits on efficiency and capacitance for a given configuration.

SUMMARY

According to one embodiment of the present invention, a MIM capacitor includes an insulative substrate. A first cavity formed in the insulative substrate may have a first metal layer conformally deposited therein, and an insulator layer may be conformally deposited on the first metal layer. A second metal layer may further be deposited on the insulator layer, and a dielectric cap may be included.

Another embodiment of the invention disclosed herein includes a method of fabricating a MIM capacitor in an insulative substrate. An insulative substrate may be provided, and a first cavity may be formed in the insulative substrate. A first metal layer may be formed in the first cavity, and an insulator layer may be formed on an exposed surface of the first metal layer. A second metal layer may further be formed on the insulator layer, and a dielectric cap may be formed.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Embodiments of the invention disclosed herein provide a more efficient MIM capacitor that may be formed in an insulative substrate as part of back end of line (BEOL) processes. As a result, some processes employed in microfabrication may not be appropriate for fabrication of embodiments of the invention disclosed herein. For example, processes requiring temperatures that might damage components and/or devices already extant on a substrate in which embodiments of the invention disclosed herein might be formed would be inappropriate and/or undesirable. Hence, lower temperature and less damaging processes are more appropriate for use in the fabrication of embodiments of the inventive MIM capacitor.

Figure 1:
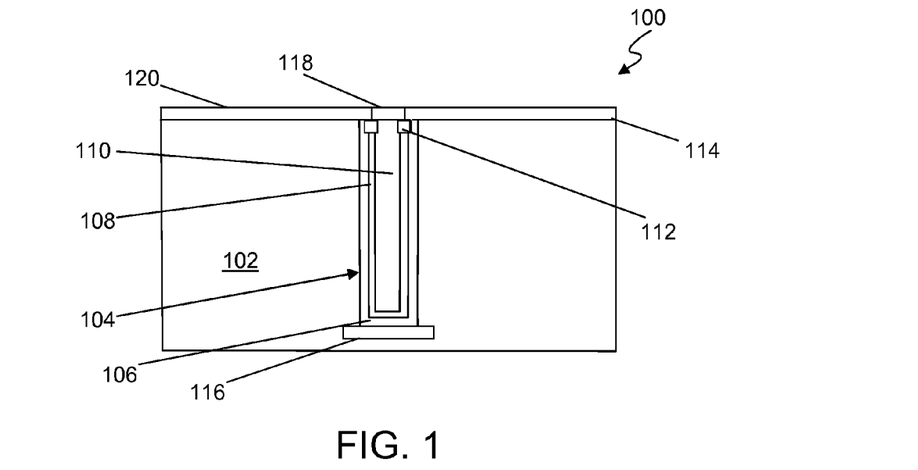
FIG. 1 is a schematic illustration of a MIM capacitor according to an embodiment of the invention disclosed herein.

With reference now to the accompanying drawings, and particularly now to FIG. 1, a metal insulator metal (MIM) capacitor 100 includes an insulative substrate 102, in which a first cavity 104 may be formed. For example, insulative substrate 102 may be a BEOL interlevel dielectric layer and/or a BEOL intermetal dielectric layer in embodiments. A first metal layer 106 may lie within cavity 104, such as by being conformally deposited. An insulator layer 108 may lie on first metal layer 106, such as by being conformally deposited on first metal layer 106, and a second metal layer 110 may lie on insulator layer 108. In embodiments, second metal layer 110 may be conformally deposited on insulator layer 108 and additional metal may fill any remaining cavity, though in embodiments second metal layer 110 simply fills any remaining cavity as shown in FIG. 1. A dielectric cap 112, shown as two insulative plugs in FIG. 1, may be formed at ends of insulator layer 108 so that an additional layer of material may overlie an end of insulator layer 108 and be flush with a top surface 114 of insulative substrate 102. A first contact 116 and a second contact 118 may be formed so that they are each electrically connected to a respective one of first and second metal layers 106, 110. In embodiments, first contact 116 is deposited before first metal layer 106 is formed. A cover layer 120, such as of an insulative material, may be formed on top surface 114, and second contact 118 may be formed using a via through cover layer 120.

Figure 2:
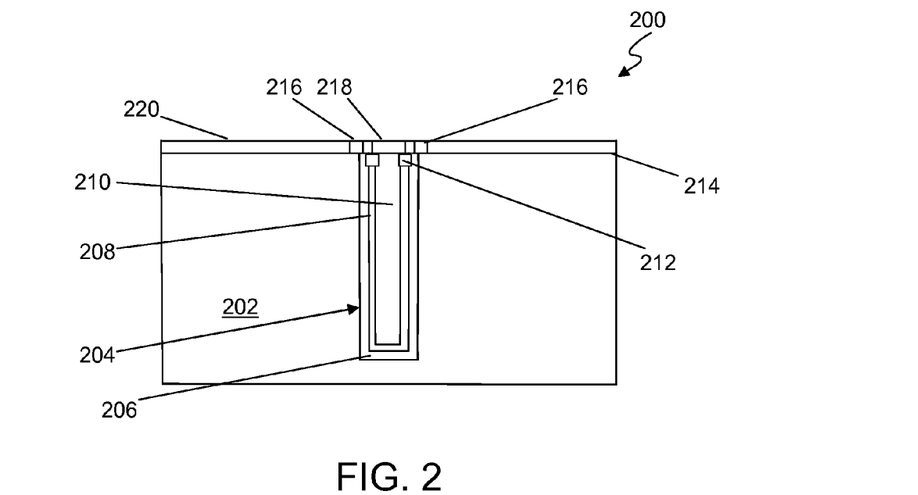
FIG. 2 is a schematic illustration of a MIM capacitor according to an embodiment of the invention disclosed herein.

With reference now to FIG. 2, a metal insulator metal (MIM) capacitor 200 includes an insulative substrate 202 in which a first cavity 204 may be formed. For example, insulative substrate 202 may be a BEOL interlevel dielectric layer and/or a BEOL intermetal dielectric layer in embodiments. A first metal layer 206 may lie within cavity 204, such as by being conformally deposited. An insulator layer 208 may lie on first metal layer 206, such as by being conformally deposited on first metal layer 206, and a second metal layer 210 may lie on insulator layer 208. In embodiments, second metal layer 210 may be conformally deposited on insulator layer 208 and additional metal may fill any remaining cavity, though in embodiments second metal layer 210 may simply fill any remaining cavity as shown in FIG. 2. A dielectric cap 212, shown as two insulative plugs in FIG. 2, may be formed at ends of insulator layer 208 so that an additional layer of material may overlie an end of insulator layer 208 and be flush with a top surface 214 of insulative substrate 202. A first contact 216 and a second contact 218 may be formed so that they are each electrically connected to a respective one of first and second metal layers 206, 210. In embodiments, a cover layer 220, such as of an insulative material, may be formed on top surface 214, and both first contacts 216 and second contact 218 may be formed using vias through cover layer 220.

Figure 3:
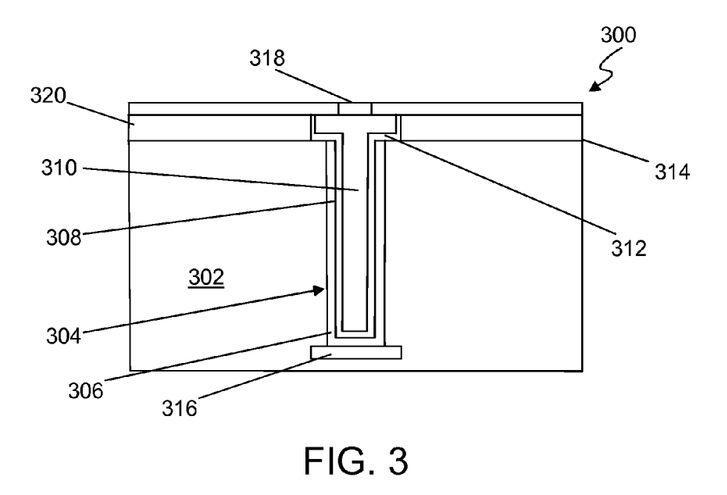
FIG. 3 is a schematic illustration of a MIM capacitor according to an embodiment of the invention disclosed herein.

With reference now to FIG. 3, a metal insulator metal (MIM) capacitor 300 includes an insulative substrate 302 in which a first cavity 304 may be formed. For example, insulative substrate 302 may be a BEOL interlevel dielectric layer and/or a BEOL intermetal dielectric layer in embodiments. A first metal layer 306 may lie within cavity 304, such as by being conformally deposited. An insulator layer 308 may lie on first metal layer 306, such as by being conformally deposited on first metal layer 306, and a second metal layer 310 may lie on insulator layer 308. In embodiments, second metal layer 310 may be conformally deposited on insulator layer 308 and additional metal may fill any remaining cavity, though in embodiments second metal layer 310 simply fills any remaining cavity as shown in FIG. 3. A dielectric cap 312, shown as extensions of insulator layer 308 in FIG. 3, may be formed at ends of insulator layer 308 so that an additional layer of material may overlie an end of first metal layer 306 and be flush with a top surface 314 of insulative substrate 302. A first contact 316 and a second contact 318 may be formed so that they are each electrically connected to a respective one of first and second metal layers 306, 310. In embodiments, first contact 316 is deposited before first metal layer 306 is formed. A cover layer 320, such as of an insulative material, may be formed on top surface 314, and second contact 318 may be formed using a via through cover layer 320.

Figure 4:
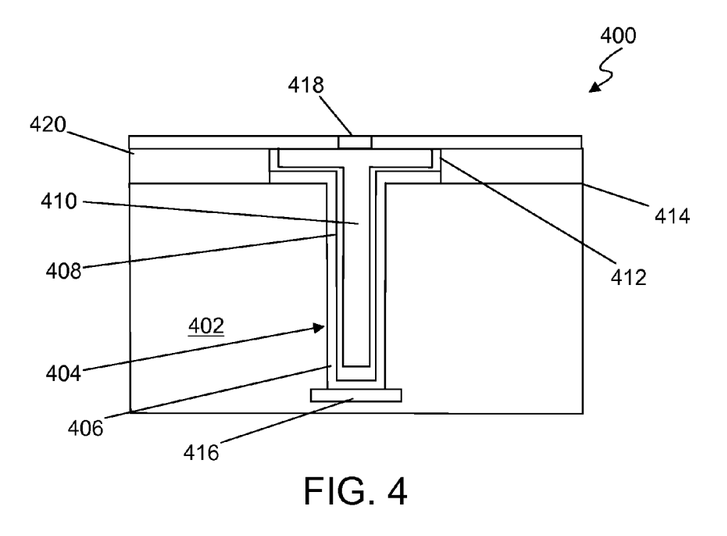
FIG. 4 is a schematic illustration of a MIM capacitor according to an embodiment of the invention disclosed herein.

With reference now to FIG. 4, a metal insulator metal (MIM) capacitor 400 includes an insulative substrate 402 in which a first cavity 404 may be formed. For example, insulative substrate 402 may be a BEOL interlevel dielectric layer and/or a BEOL intermetal dielectric layer in embodiments. A first metal layer 406 may lie within cavity 404, such as by being conformally deposited. An insulator layer 408 may lie on first metal layer 406, such as by being conformally deposited on first metal layer 406, and a second metal layer 410 may lie on insulator layer 408. In embodiments, second metal layer 410 may be conformally deposited on insulator layer 408 and additional metal may fill any remaining cavity, though in embodiments second metal layer 410 simply fills any remaining cavity as shown in FIG. 4. A dielectric cap 412, shown as extensions of insulator layer 408 in FIG. 4, may be formed at ends of insulator layer 408 so that an additional layer of material may overlie an end of first metal layer 406 and be flush with a top surface 414 of insulative substrate 402. A first contact 416 and a second contact 418 may be formed so that they are each electrically connected to a respective one of first and second metal layers 406, 410. In embodiments, first contact 416 is deposited before first metal layer 406 is formed. A cover layer 420, such as of an insulative material, may be formed on top surface 414, and second contact 418 may be formed using a via through cover layer 420.

Figure 5:
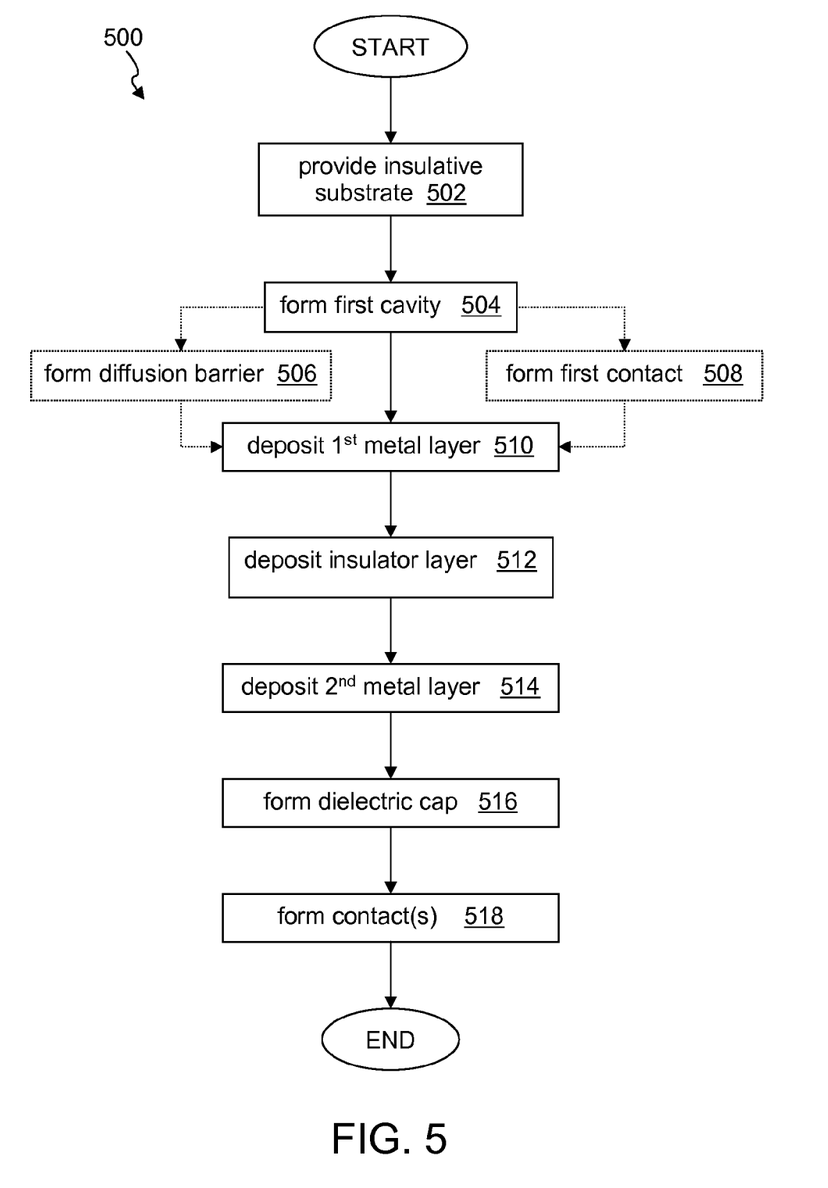
FIG. 5 is a schematic flow diagram of a method of fabricating a MIM capacitor according to an embodiment of the invention disclosed herein.

An example of a method 500 of making a MIM capacitor such as the examples shown schematically in FIGS. 1-4 is seen in FIG. 5. An insulative substrate may be provided (block 502), such as a BEOL interlevel dielectric layer and/or a BEOL intermetal dielectric layer in embodiments, and a first cavity may be formed (block 504). In embodiments, a diffusion barrier may be deposited on the surface(s) of the first cavity (block 506), such as to prevent bleed of ions from the MIM capacitor into the substrate and vice versa. An example of a material suitable for use as a diffusion barrier is titanium nitride (TiN), though any other suitable material now known and/or later discovered and/or developed may be employed as desired and/or required for given configuration. In addition, in embodiments such as those shown in FIGS. 1, 3, and 4, a first contact may be formed (block 508), such as by depositing conductive material in the closed end of first cavity 104, 304, 404.

A first metal layer may be deposited (block 510), and an insulator layer may be deposited (block 512). The deposition of the first metal layer and/or the insulator layer may be achieved using conformal deposition, such as chemical vapor deposition (CVD), physical vapor deposition (PVD), and/or any other suitable technique now known and/or later developed. A second metal layer may then be formed (block 514), and a dielectric cap may be formed (block 516). In embodiments, the second metal layer fills whatever cavity remains after depositing the insulator layer, but other embodiments produce a conformal second metal layer that leaves a portion of the first cavity that may be filled with additional conductive material. A second contact may be formed (block 518), though in embodiments where the first contact is not in the closed end of the first cavity, both first and second contacts may be formed.

Figure 6:
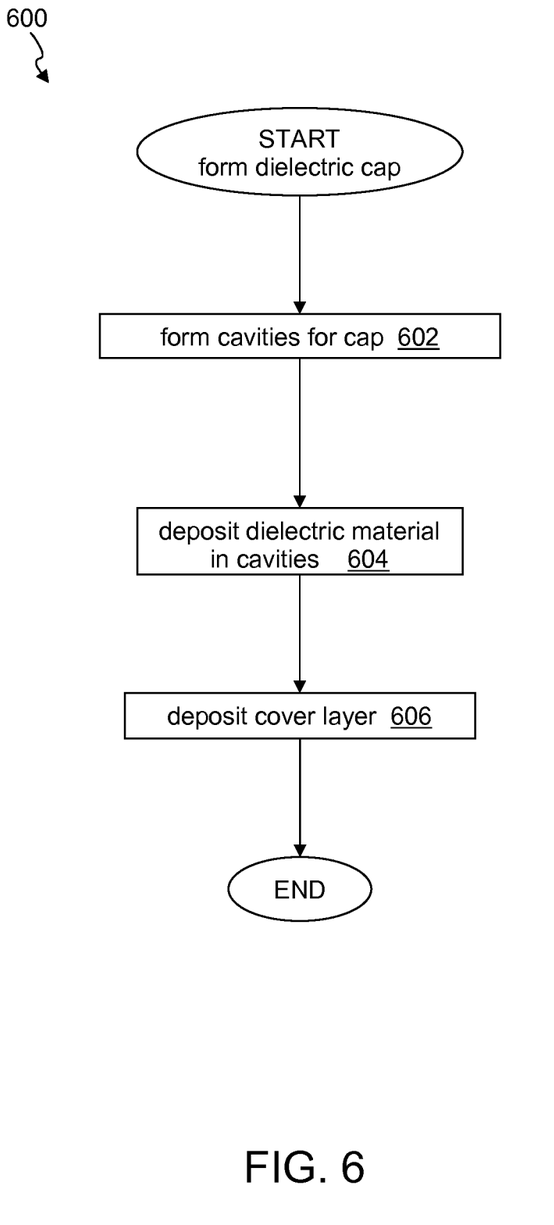
FIGS. 6-10 are schematic illustrations of stages of manufacture of a MIM capacitor according to an embodiment of the invention disclosed herein and as shown in FIG. 1.
Figure 7:
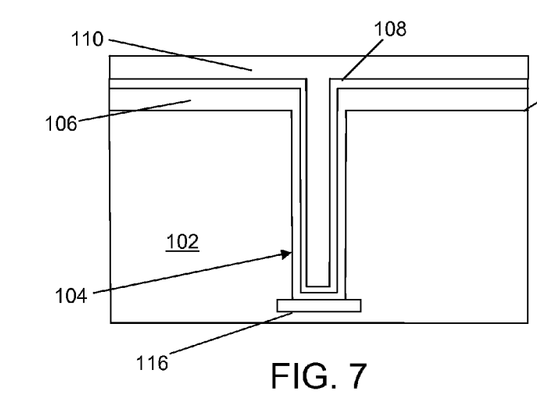
Figure 8:
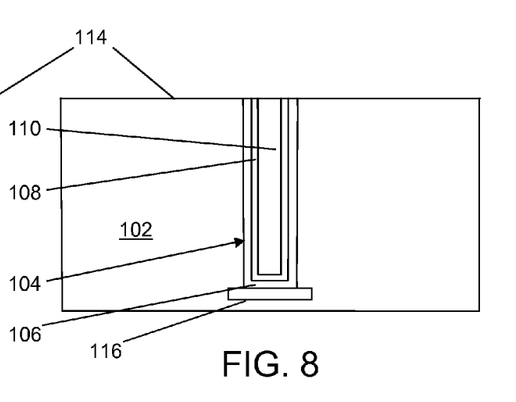

An example of a method 600 of forming a dielectric cap 112, 212 is shown schematically in FIG. 6. The method 600 may include forming cavities (block 602) and depositing dielectric material in the cavities (block 604). For example, a collar pattern and RIE technique may be employed, followed by deposition of insulative material in the resulting cavities. Cover layer 320 may then be deposited (block 606), and second contact 118, 218 may be formed.

Figure 9:
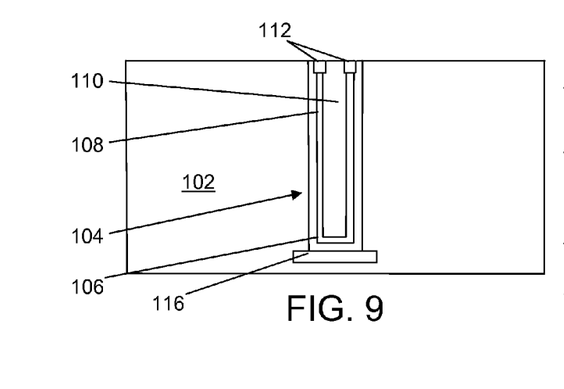
Figure 10:
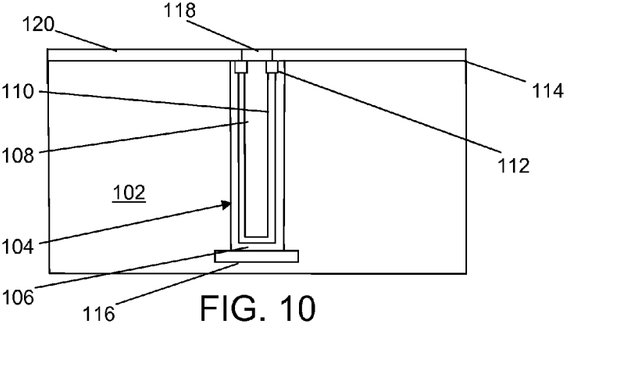
Figure 11:
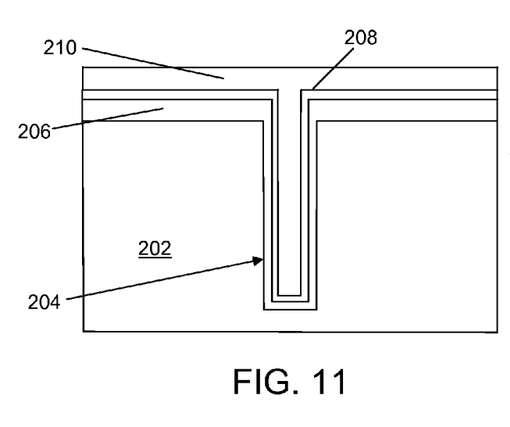
FIGS. 11-14 are schematic illustrations of stages of manufacture of a MIM capacitor according to an embodiment of the invention disclosed herein and as shown in FIG. 2.
Figure 12:
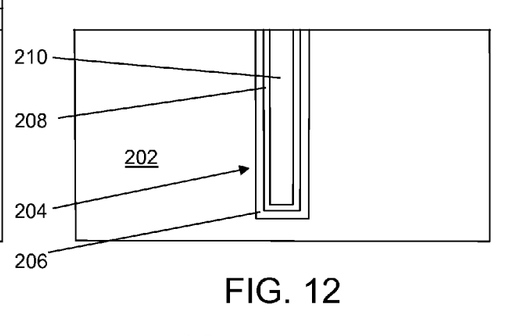

FIGS. 7-10 show stages of forming a MIM capacitor 100 as seen in FIG. 1 resulting from the application of methods 500, 600. After deposition of the first contact 116, the first metal layer 106, the insulator layer 108, and the second metal layer 110, a structure such as that shown in FIG. 7 may be produced. To proceed to a state in which dielectric cap 112 may be formed, excess material on a surface 114 of substrate 102 may be removed. For example, chemical-mechanical polishing (CMP) or any other suitable technique may be employed to remove excess portions of first metal layer 106, insulator layer 108, and second metal layer 110, exposing surface 114 of substrate 102, as seen, for example, in FIG. 8. Portions of first metal layer 106, insulator layer 108, and second metal layer 110 may be removed to form cavities in which dielectric cap 112 may be formed as seen in FIG. 9. For example, a collar pattern and RIE technique may be employed, followed by deposition of insulative material in the resulting cavities. If excess material results, it may be removed using any suitable technique, such as CMP, to yield ends of first metal layer 106, insulator layer 108, second metal layer 110, and/or dielectric cap 112 that are flush with surface 114 of substrate 102, again as seen in FIG. 9. Cover layer 120 may then be deposited, and a via may be formed so that second metal contact 118 may be deposited or otherwise formed in electrical contact with second metal layer 110, as seen in FIGS. 1 and 10. In embodiments in which a diffusion barrier is included, a diffusion barrier is deposited after formation of first cavity 104, preferably before formation of first contact 116.

Figure 13:
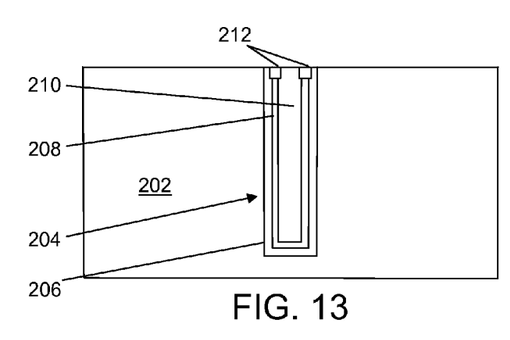
Figure 14:
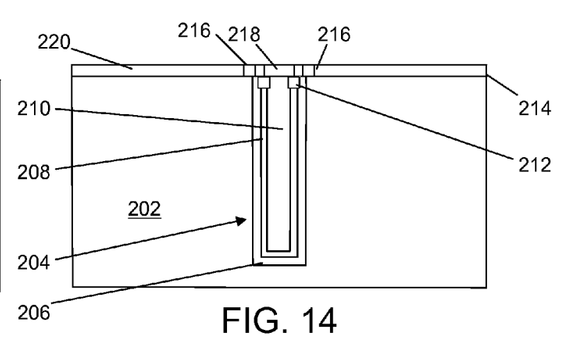

As seen in FIGS. 2 and 11-14, embodiments need not have first contact 116 in the closed end of first cavity 104. First contact 116 may be formed later in the process, as will be seen below, though the structure and process may still closely resemble the example shown in FIGS. 7-10. First metal layer 206, insulator layer 208, and second metal layer 210 are deposited in first cavity 204, yielding a structure such as that shown in FIG. 11. Excess material on a surface 214 of substrate 202 may be removed, such as by CMP or any other suitable technique, to expose surface 214 of substrate 202, as seen, for example, in FIG. 12. Portions of first metal layer 206, insulator layer 208, and second metal layer 210 may be removed according to embodiments employing method 400 to form cavities in which dielectric cap 212 may be formed as seen in FIG. 13. For example, a collar pattern and RIE technique may be employed, followed by deposition of insulative material in the resulting cavities. If excess material results, it may be removed using any suitable technique, such as CMP, to yield ends of first metal layer 206, insulator layer 208, second metal layer 210, and/or dielectric cap 212 that are flush with surface 214 of substrate 202, again as seen in FIG. 13. As shown in FIG. 14, cover layer 220 may then be deposited, and vias may be formed to allow formation of first and/or second metal contacts 216, 218 in electrical contact with respective first and second metal layers 206, 210. In this manner, both first and second contacts 216, 218 may be formed on a same end of first cavity 204, which may allow easier access and/or enhance performance of MIM capacitor 200. In embodiments in which a diffusion barrier is included, a diffusion barrier may be deposited after formation of first cavity 204, such as before formation of first contact 216.

Figure 15:
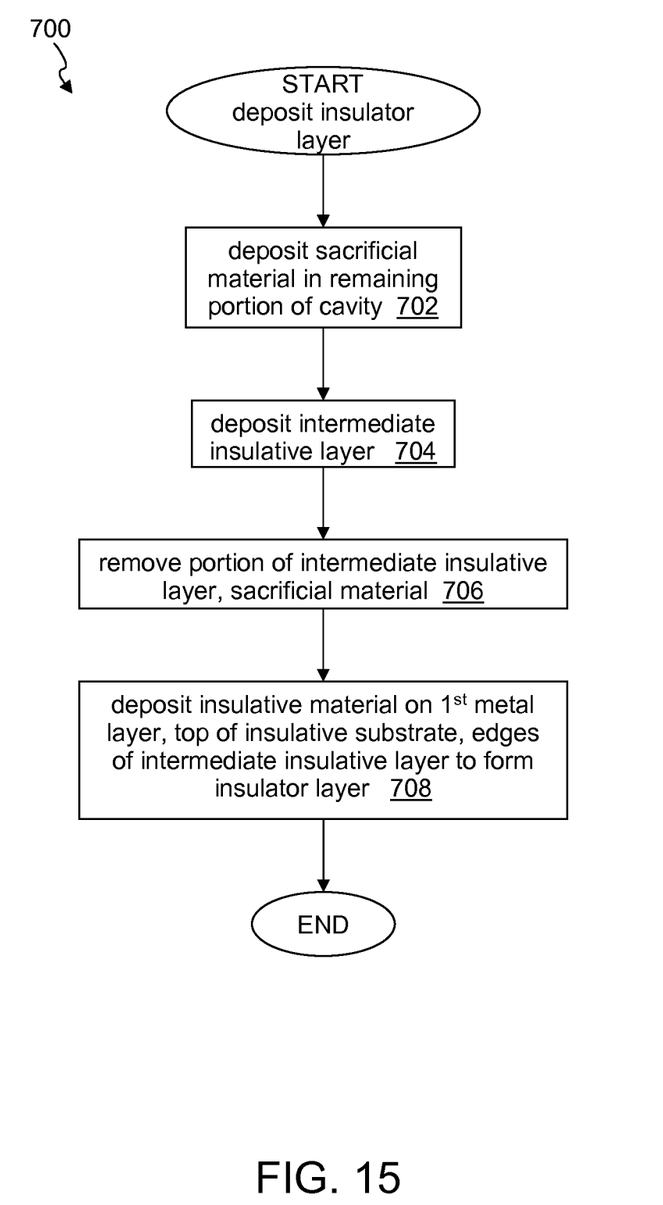
FIG. 15 is a schematic flow diagram of a method of depositing an insulator layer of a MIM capacitor according to an embodiment of the invention disclosed herein and as seen in FIG. 3.
Figure 16:
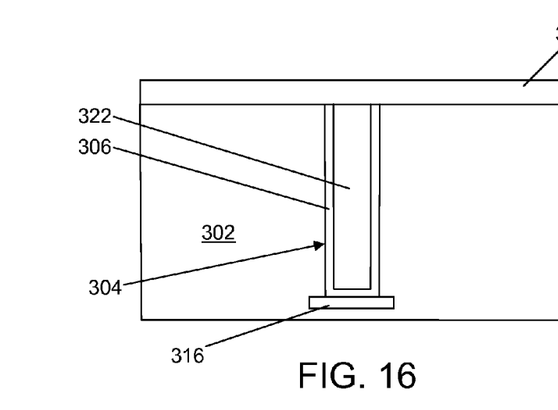
FIGS. 16-19 are schematic illustrations of stages of manufacture of a MIM capacitor according to an embodiment of the invention disclosed herein and as shown in FIG. 3.
Figure 17:
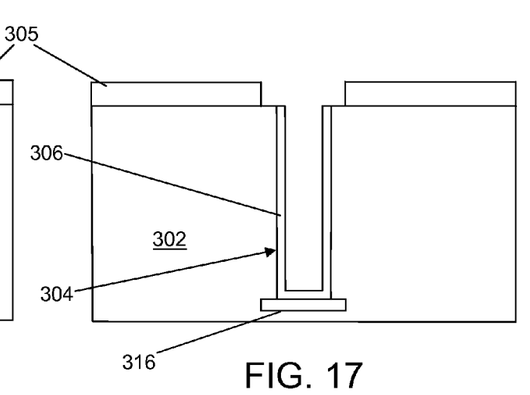
Figure 18:
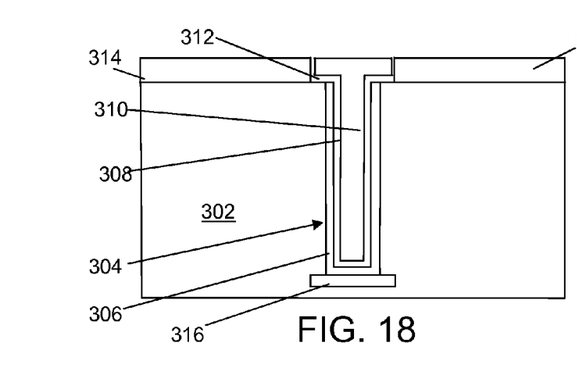
Figure 19:
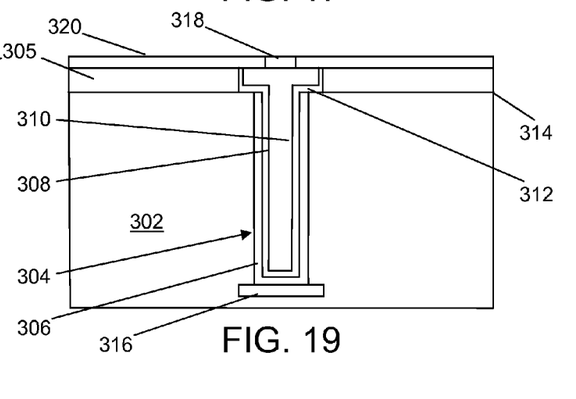

In the embodiments shown in FIGS. 1, 2, and 7-14, dielectric cap 112, 212 may be formed after deposition of first and second metal layers 106, 110 and insulator layer 108. However, as seen in FIG. 3, dielectric cap 312 may be formed with or by deposition of insulator layer 308. An alternative method 700 of depositing an insulator layer is seen in FIG. 15, with stages of manufacture shown in FIGS. 16-19. Alternative method 500 may include, after deposition of first metal layer 306, depositing sacrificial material 322 in a remaining portion of first cavity 304 (block 702), as seen in FIG. 16. If necessary, CMP or another technique may be employed to make deposited materials flush with surface 314 of substrate 302, and an intermediate insulative layer 305 may then be deposited (block 704) on surface 314, again as seen in FIG. 16. A portion of intermediate insulative layer 305 and sacrificial material 322 may then be removed (block 706) so that ends of first metal layer 306 and a portion of surface 314 are exposed, as well as surfaces of first metal layer 306 in first cavity 304 and exposed edge surfaces of intermediate insulative layer 305, as seen in FIG. 17. Insulator layer 308 may then be deposited (block 708), such as to cover the exposed portion of surface 314, ends of first metal layer 306, and edge surfaces of intermediate insulative layer 305, as seen in FIGS. 18 and 19. Deposition of insulator layer 308 in this configuration forms dielectric cap 312 across ends of first metal layer 306, the exposed portion of surface 314, and edge surfaces of intermediate insulative layer 305. Second metal layer 310 may then be deposited, followed by deposition of cover layer 320 and formation of second contact 318, as seen in FIG. 19.

Figure 20:
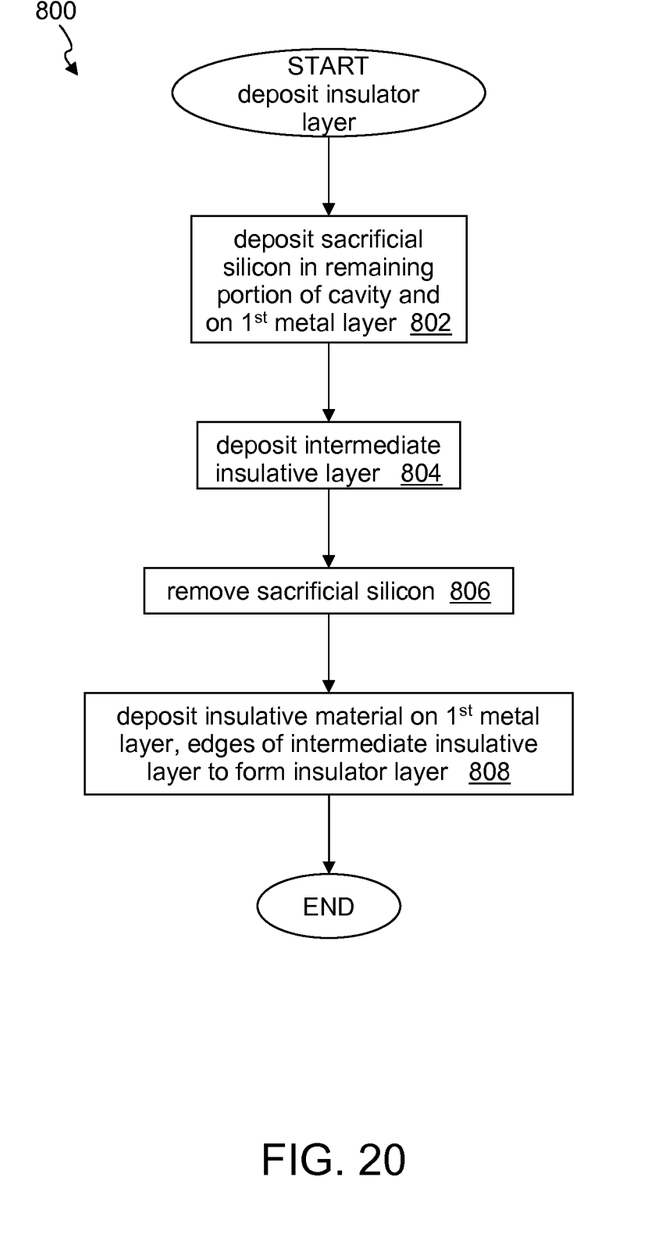
FIG. 20 is a schematic flow diagram of a method of depositing an insulator layer of a MIM capacitor according to an embodiment of the invention disclosed herein and as seen in FIG. 4.
Figures 21, 23:
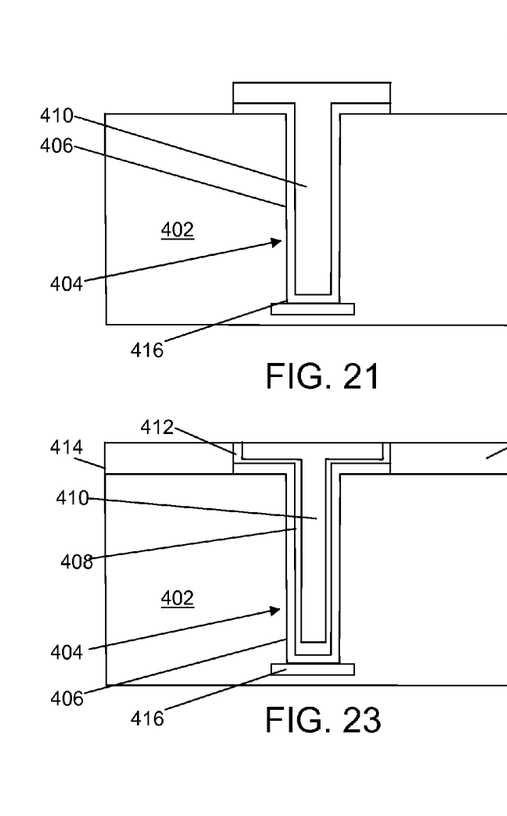
FIGS. 21-24 are schematic illustrations of stages of manufacture of a MIM capacitor according to an embodiment of the invention disclosed herein and as shown in FIG. 4.
Figure 22:
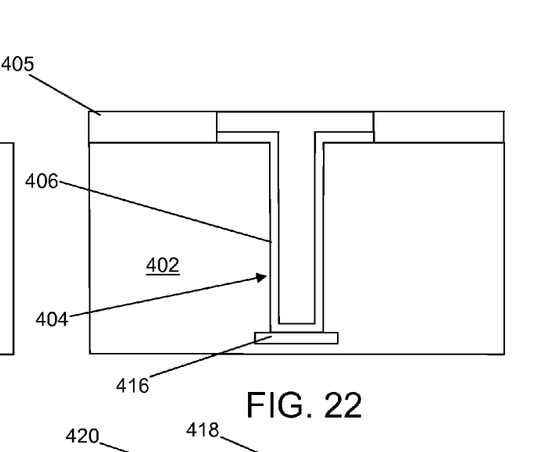
Figure 24:
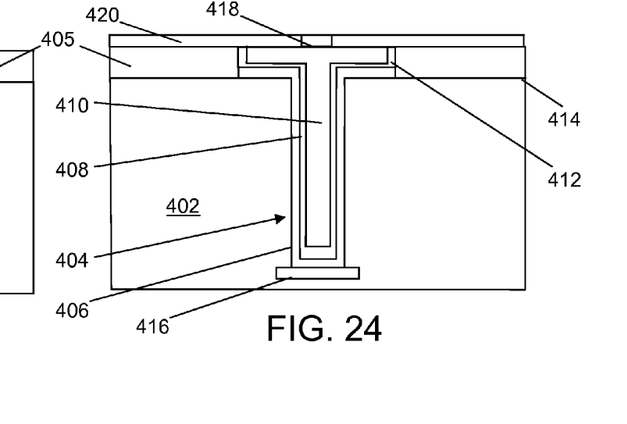

FIG. 20 schematically illustrates another method 800 of depositing an insulator layer that may yield a MIM capacitor 400 according to embodiments such as the example of FIG. 4, with stages of manufacture shown schematically in FIGS. 21-24. As seen in FIG. 21, first metal layer 406 may have been deposited so that portions of first metal layer 406 extend along surface 414 of substrate 402. Sacrificial silicon may be deposited in a remaining portion of first cavity 404 and to overlie the portions of first metal layer 406 extending along surface 414 (block 802), as seen in FIG. 21. An intermediate insulative layer 405 may then be deposited (block 804), and the sacrificial silicon may be removed (block 806) to expose first metal layer 406. Insulative material may be deposited on first metal layer 406 (block 808) to form insulator layer 408 and dielectric cap 412, as seen in FIGS. 23 and 24. Second metal layer 410 may then be formed, as well as cover layer 420 and second contact 418, as seen in FIGS. 4 and 24. As shown in FIGS. 4, 23, and 24, dielectric cap 412 includes portions of insulator layer 408 overlying surface 414 of substrate 404.

A seen in FIGS. 3, 4, 19, and 24, second metal layer 310, 410 and/or fill metal forms a T shape in which a portion of second metal layer 310, 410 is parallel to and/or overlies a portion of surface 314, 414 of insulative substrate 302, 402, which surface 314, 414 is at an open end of first cavity 304, 404. So arranging second metal layer 310, 410 over first metal layer 306, 406, insulator layer 308, 408, and dielectric cap 312, 412 enhances performance of a MIM capacitor according to embodiments.

Constructing a MIM capacitor according to embodiments of the invention disclosed herein may yield a capacitor that requires less surface area on a substrate for a given capacitance than may be required by other MIM capacitors. A MIM capacitor according to embodiments may, for example, achieve a higher capacitance density than planar MIM capacitors, and inclusion of a dielectric cap according to embodiments may reduce damage done to insulative material of the MIM capacitor that might otherwise occur during CMP and/or other manufacturing stages and/or techniques.

Figure 25:
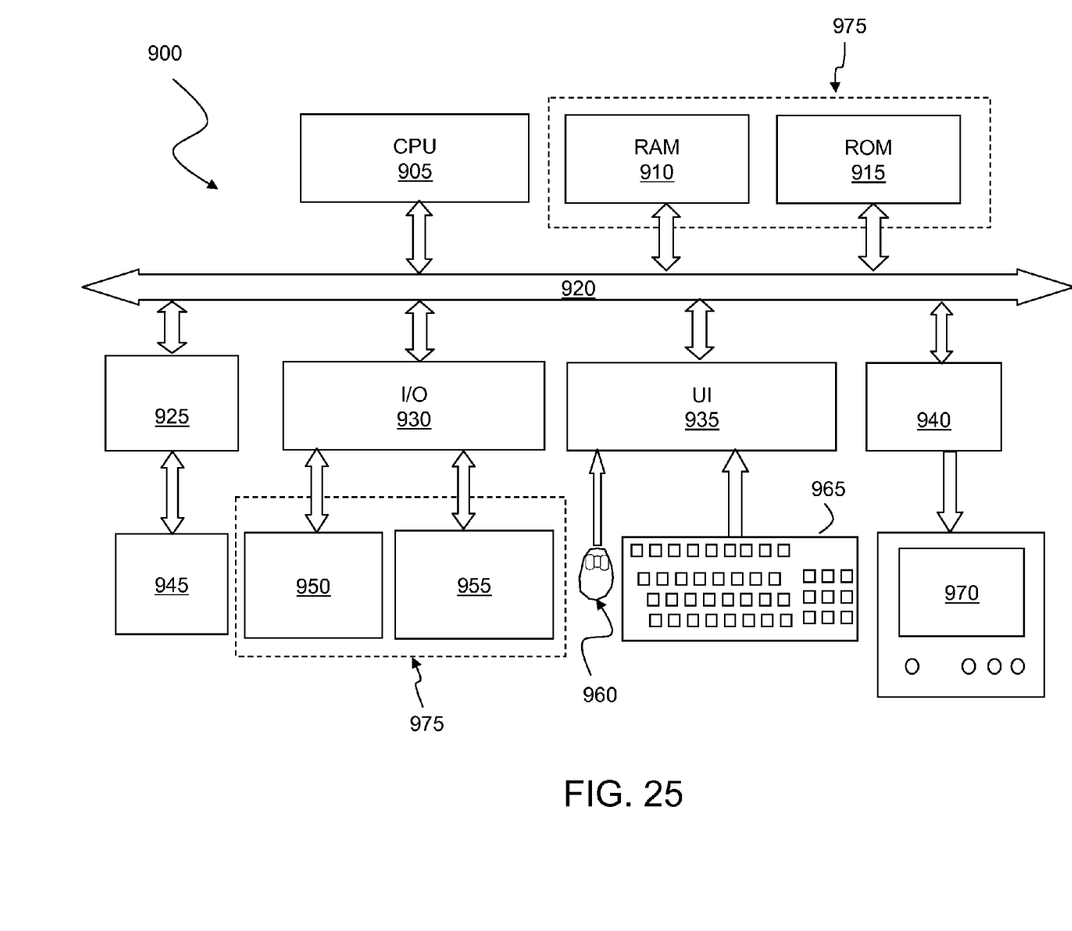
FIG. 25 is a schematic block diagram of a general purpose computer system which may be used to practice the invention.

A MIM capacitor according to embodiments of the invention disclosed herein may be implemented as a circuit design structure. FIG. 25 illustrates a block diagram of a general-purpose computer system which can be used to implement the circuit and circuit design structure described herein. The design structure may be coded as a set of instructions on removable or hard media for use by general-purpose computer. FIG. 25 is a schematic block diagram of a general-purpose computer for practicing the present invention. FIG. 25 shows a computer system 900, which has at least one microprocessor or central processing unit (CPU) 905. CPU 905 is interconnected via a system bus 920 to machine readable media 975, which includes, for example, a random access memory (RAM) 910, a read-only memory (ROM) 915, a removable and/or program storage device 955 and a mass data and/or program storage device 950. An input/output (I/O) adapter 930 connects mass storage device 950 and removable storage device 955 to system bus 920. A user interface 935 connects a keyboard 965 and a mouse 960 to system bus 920, and a port adapter 925 connects a data port 945 to system bus 920 and a display adapter 940 connect a display device 970. ROM 915 contains the basic operating system for computer system 900. Examples of removable data and/or program storage device 955 include magnetic media such as floppy drives, tape drives, portable flash drives, zip drives, and optical media such as CD ROM or DVD drives. Examples of mass data and/or program storage device 950 include hard disk drives and non-volatile memory such as flash memory. In addition to keyboard 965 and mouse 960, other user input devices such as trackballs, writing tablets, pressure pads, microphones, light pens and position-sensing screen displays may be connected to user interface 935. Examples of display device 970 include cathode-ray tubes (CRT) and liquid crystal displays (LCD).

A machine readable computer program may be created by one of skill in the art and stored in computer system 900 or a data and/or any one or more of machine readable medium 975 to simplify the practicing of this invention. In operation, information for the computer program created to run the present invention is loaded on the appropriate removable data and/or program storage device 955, fed through data port 945 or entered using keyboard 965. A user controls the program by manipulating functions performed by the computer program and providing other data inputs via any of the above mentioned data input means. Display device 970 provides a means for the user to accurately control the computer program and perform the desired tasks described herein.

Figure 26:
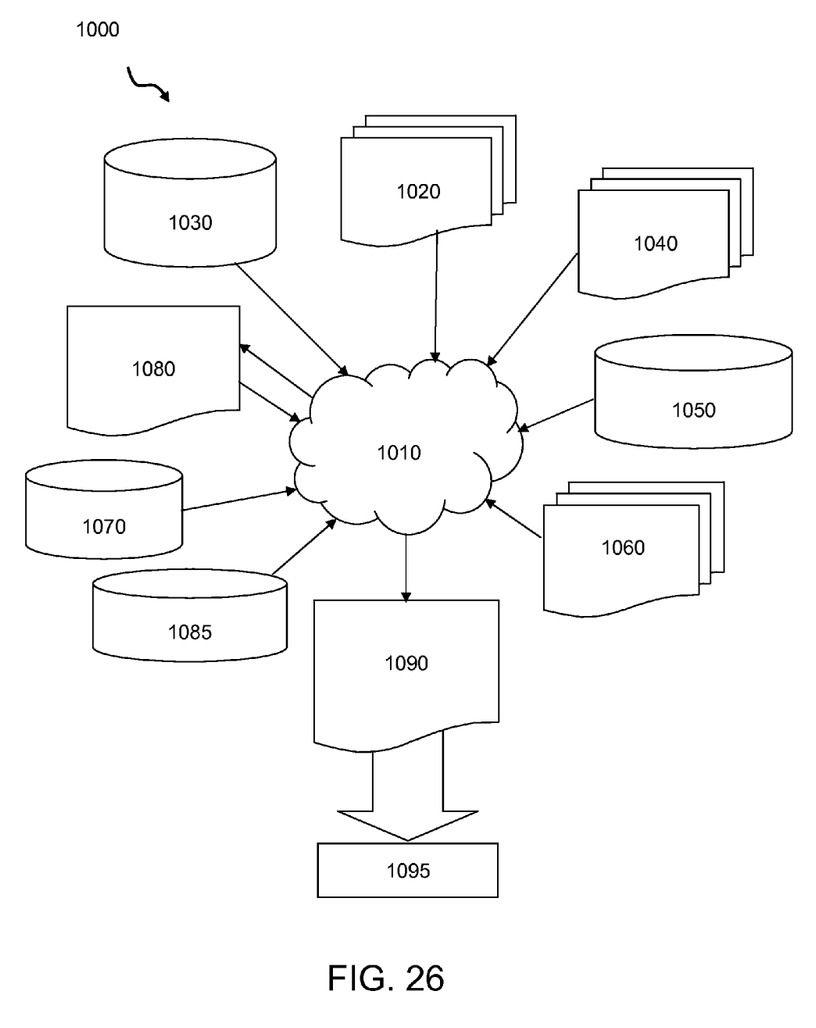
FIG. 26 is a schematic flow diagram of a design process used in semiconductor design, manufacturing, and/or test.

FIG. 26 shows a block diagram of an example design flow 1000. Design flow 1000 may vary depending on the type of IC being designed. For example, a design flow 1000 for building an application specific IC (ASIC) may differ from a design flow 1000 for designing a standard component. Design structure 1020 is preferably an input to a design process 1010 and may come from an IP provider, a core developer, or other design company or may be generated by the operator of the design flow, or from other sources. Design structure 1020 comprises circuit or capacitor 100, 200, 300, 400 in the form of schematics or HDL, a hardware-description language (e.g., Verilog, VHDL, C, etc.). Design structure 1020 may be contained on one or more machine readable medium. For example, design structure 1020 may be a text file or a graphical representation of circuit or capacitor 100, 200, 300, 400. Design process 1010 preferably synthesizes (or translates) circuit or capacitor 100, 200, 300, 400 into a netlist 1080, where netlist 1080 is, for example, a list of wires, transistors, logic gates, control circuits, I/O, models, etc., that describes the connections to other elements and circuits in an integrated circuit design and recorded on at least one of machine readable medium. This may be an iterative process in which netlist 1080 is re-synthesized one or more times depending on design specifications and parameters for the circuit.

Design process 1010 may include using a variety of inputs; for example, inputs from library elements 1030 which may house a set of commonly used elements, circuits, and devices, including models, layouts, and symbolic representations, for a given manufacturing technology (e.g., different technology nodes, 32 nm, 45 nm, 100 nm, etc.), design specifications 1040, characterization data 1050, verification data 1060, design rules 1070, and test data files 1085 (which may include test patterns and other testing information). Design process 1010 may further include, for example, standard circuit design processes such as timing analysis, verification, design rule checking, place and route operations, etc. One of ordinary skill in the art of integrated circuit design can appreciate the extent of possible electronic design automation tools and applications used in design process 1010 without deviating from the scope and spirit of the invention. The design structure of the invention is not limited to any specific design flow.

Ultimately, design process 1010 preferably translates circuit or capacitor 100, 200, 300, 400, 300, along with the rest of the integrated circuit design (if applicable), into a final design structure 1090 (e.g., information stored in a GDS storage medium). Final design structure 1090 may comprise information such as, for example, test data files, design content files, manufacturing data, layout parameters, wires, levels of metal, vias, shapes, test data, data for routing through the manufacturing line, and any other data required by a semiconductor manufacturer to produce circuit or capacitor 100, 200, 300, 400, 300. Final design structure 1080 may then proceed to a stage 1085 where, for example, final design structure 1080 proceeds to tape-out, is released to manufacturing, is sent to another design house or is sent back to the customer.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A MIM capacitor structure comprising:
an insulative substrate;
a first cavity formed in the insulative substrate;
a first metal layer conformally deposited in the first cavity;
an insulator layer conformally deposited on the first metal layer;
a second metal layer deposited directly on the insulator layer; and
an enlarged, relative to the insulator layer, dielectric cap of the insulator layer, at least one top surface of the dielectric cap being substantially flush with at least one top surface of the second metal layer, and an entirety of the insulator layer being below the dielectric cap and the at least one top surface of the second metal layer, and wherein the at least one top surface of the dielectric cap and the at least one top surface of the second metal layer are substantially flush with a top surface of a layer in which the dielectric cap is formed.

2. The structure of claim 1, wherein the wherein the dielectric cap contacts the second metal layer and leaves at least a portion of a top surface of the second metal layer exposed.

3. The structure of claim 2, wherein the dielectric cap contacts the first metal layer and leaves at least a portion of a top surface of the first metal layer.

4. The structure of claim 2, wherein each of the first contact and the second contact are electrically connected to a respective one of the first metal layer and the second metal layer at the surface of the insulative substrate at the opening of the first cavity.

5. The structure of claim 1, wherein the dielectric cap includes an extension of the insulator layer along a surface of the insulative substrate that is substantially perpendicular to a wall of the first cavity.

6. The structure of claim 1, wherein the insulator layer is formed from a first dielectric material with an end surface substantially parallel to a top surface of the insulative substrate, and the dielectric cap includes a second dielectric material deposited at the end surface of the insulator layer.

7. The structure of claim 1, wherein the first metal layer includes an extension along a top surface of the insulative substrate.

8. The structure of claim 1, wherein the second metal layer includes an extension substantially parallel to a top surface of the insulative substrate.

9. The structure of claim 1, wherein the dielectric cap is formed proximate a top surface of the insulative substrate and overlies at least a portion of the first metal layer, and at least a portion of the second metal layer is not covered by the dielectric cap.

10. The structure of claim 1, further comprising a cover layer formed on the insulative substrate and covering substantially all exposed surfaces of the first metal layer, the insulator layer, and the second metal layer, the cover layer being formed from an insulative material.

11. The structure of claim 10, wherein the dielectric cap is at least partly between the first and second metal layers and is at least partly between the cover layer and at least part of at least one side surface of the second metal layer.

12. A MIM capacitor structure comprising:
an insulative substrate having a top surface and a bottom surface;
a first cavity formed in the insulative substrate and extending from the top surface of the insulative substrate toward the bottom surface of the insulative substrate;
a first metal layer conformally deposited in the first cavity;
an insulator layer conformally deposited on the first metal layer;
a second metal layer deposited directly on the insulator layer;
an enlarged, relative to the insulator layer, dielectric cap of the insulator layer at least partly between the first and second metal layers, and an entirety of the insulator layer being below the dielectric cap and at least one top surface of the second metal layer; and
a cover layer formed from an insulative material and that contacts and substantially covers otherwise exposed portions of the insulative substrate, at least a portion of the dielectric cap, and at least a portion of the second metal layer, and wherein the insulator layer ends below the top surface of the insulative substrate, the dielectric cap covers and extends from ends of the insulator layer, and a top surface of the dielectric cap is substantially flush with the top surface of the insulative substrate.

13. The structure of claim 12, wherein at least a portion of the dielectric cap is between the second metal layer and the cover layer.

14. The structure of claim 12, wherein the at least a portion of the dielectric cap is in contact with and lies between the insulator layer and the cover layer.

15. The structure of claim 12, wherein the dielectric cap overlies and contacts at least a portion of the first metal layer and covers and contacts at least one side surface of the second metal layer such that at least a portion of the dielectric cap lies between the at least one side surface and the cover layer.

16. The structure of claim 12, wherein the dielectric cap is formed from a different layer of material than either of the insulator layer or the cover layer.

17. The structure of claim 12, wherein at least a portion of a top surface of the second metal layer remains uncovered by the dielectric cap.

18. The structure of claim 12, wherein at least a portion of a top surface of the first metal layer remains uncovered by the dielectric cap.

19. The structure of claim 12, wherein top surfaces of at least the second metal layer, and the dielectric cap are substantially flush with at least one of each other and the top surface of the insulative substrate.

* * * * *